(12) United States Patent
Hui et al.

(10) Patent No.: US 8,349,685 B2
(45) Date of Patent: Jan. 8, 2013

(54) DUAL SPACER FORMATION IN FLASH MEMORY

(75) Inventors: Angela T. Hui, Fremont, CA (US); Shenqing Fang, Fremont, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/960,437

(22) Filed: Dec. 3, 2010

(65) Prior Publication Data

US 2012/0142175 A1    Jun. 7, 2012

(51) Int. Cl.
*H01L 21/336* (2006.01)

(52) U.S. Cl. .......................... 438/257; 438/303; 438/514

(58) Field of Classification Search ................... 438/303, 438/257, 514
See application file for complete search history.

(56) References Cited

U.S. PATENT DOCUMENTS

| | | | |
|---|---|---|---|
| 6,894,341 B2 * | 5/2005 | Sugimae et al. | 257/315 |
| 7,291,875 B2 * | 11/2007 | Sakuma et al. | 257/211 |
| 2004/0061169 A1 * | 4/2004 | Leam et al. | 257/315 |
| 2007/0034932 A1 * | 2/2007 | Kim | 257/314 |
| 2008/0009115 A1 * | 1/2008 | Willer et al. | 438/257 |

* cited by examiner

*Primary Examiner* — Jarrett Stark
*Assistant Examiner* — John M Parker
(74) *Attorney, Agent, or Firm* — Frommer Lawrence & Haug LLP; Matthew M. Gaffney (57) ABSTRACT

A method and manufacture for memory device fabrication is provided. In one embodiment, at least one oxide-nitride spacer is formed as follows. An oxide layer is deposited over a flash memory device such that the deposited oxide layer is at least 250 Angstroms thick. The flash memory device includes a substrate and dense array of word line gates with gaps between each of the word lines gate in the dense array. Also, the deposited oxide layer is deposited such that it completely gap-fills the gaps between the word line gates of the dense array of word line gates. Next, a nitride layer is depositing over the oxide layer. Then, the nitride layer is etched until the at least a portion of the oxide layer is exposed. Next, the oxide layer is etched until at least a portion of the substrate is exposed.

10 Claims, 10 Drawing Sheets

DUAL SPACER FORMATION IN FLASH MEMORY

TECHNICAL FIELD

The invention is related to computer-readable memory, and in particular, but not exclusively, to a method and manufacture for a creating a dual spacer in flash memory in such a way that the spaces between word line gates in a dense array of word line gates in the flash memory are completely gap-filled.

BACKGROUND

Various types of electronic memory have been developed in recent years. Some exemplary memory types are electrically erasable programmable read only memory (EEPROM) and electrically programmable read only memory (EPROM). EEPROM is easily erasable but lacks density in storage capacity, where as EPROM is inexpensive and denser but is not easily erased. "Flash" EEPROM, or Flash memory, combines the advantages of these two memory types. This type of memory is used in many electronic products, from large electronics like cars, industrial control systems, and etc. to small portable electronics such as laptop computers, portable music players, cell phones, and etc.

Flash memory is generally constructed of many memory cells where a single bit is held within each memory cell. Yet a more recent technology known as MirrorBit™ Flash memory doubles the density of conventional Flash memory by storing two physically distinct bits on opposite sides of a memory cell. The reading or writing of a bit occurs independently of the bit on the opposite side of the cell. A memory cell is constructed of bit lines formed in a semiconductor substrate. An oxide-nitride-oxide (ONO) dielectric layer formed over top of the substrate and bit lines. The nitride serves as the charge storage layer between two insulating layers. Word lines are then formed over top of the ONO layer perpendicular to the bit lines. Applying a voltage to the word line, acting as a control gate, along with an applied voltage to the bit line allows for the reading or writing of data from or to that location in the memory cell array. MirrorBit™ Flash memory may be applied to different types of flash memory, including NOR flash and NAND flash.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. Similarly, the phrase "in some embodiments," as used herein, when used multiple times, does not necessarily refer to the same embodiments, although it may. As used herein, the term "or" is an inclusive "or" operator, and is equivalent to the term "and/or," unless the context clearly dictates otherwise. The term "based, in part, on", "based, at least in part, on", or "based on" is not exclusive and allows for being based on additional factors not described, unless the context clearly dictates otherwise. The term "coupled" means at least either a direct electrical connection between the items connected, or an indirect connection through one or more passive or active intermediary devices. The term "signal" means at least one current, voltage, charge, temperature, data, or other signal.

Briefly stated, the invention is related to a method and manufacture for memory device fabrication. In one embodiment, at least one oxide-nitride spacer is formed as follows. An oxide layer is deposited over a flash memory device such that the deposited oxide layer is at least 250 Angstroms thick. The flash memory device includes a substrate and dense array of word line gates with gaps between each of the word lines gate in the dense array. Also, the deposited oxide layer is deposited such that it completely gap-fills the gaps between the word line gates of the dense array of word line gates. Next, a nitride layer is depositing over the oxide layer. Then, the nitride layer is etched until the at least a portion of the oxide layer is exposed. Next, the oxide layer is etched until at least a portion of the substrate is exposed.

Figure 1:
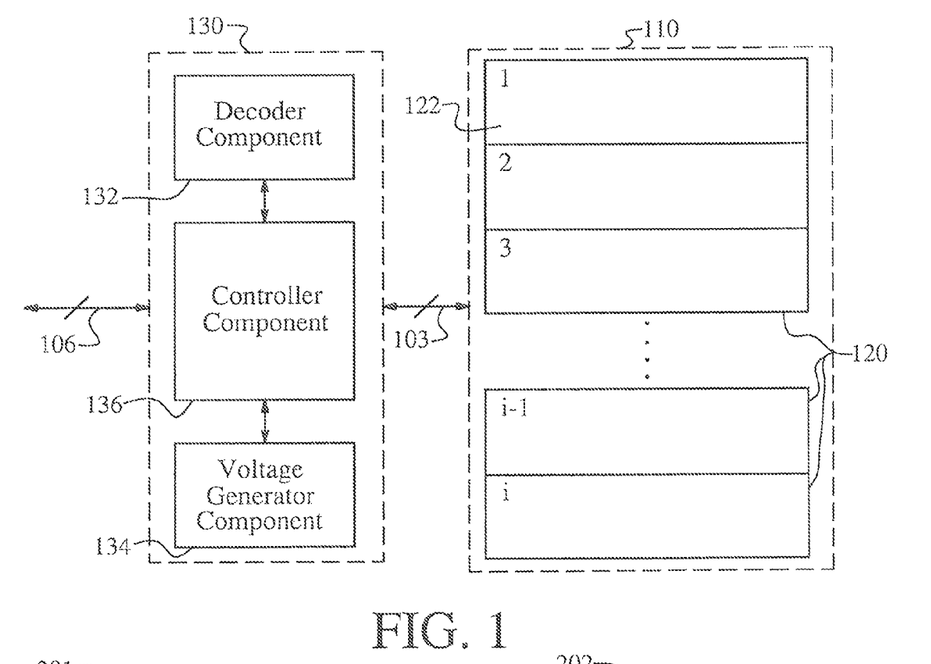
FIG. 1 illustrates a block diagram of an embodiment of a memory.

FIG. 1 shows a memory environment in which embodiments of the invention may be employed. Not all the components illustrated in the figures may be required to practice the invention, and variations in the arrangement and type of the components may be made without departing from the spirit or scope of the invention. For example, although primarily described in the context of a NAND-based flash-based memory, the fabrication described herein may be employed in manufacturing other types of devices, such as NOR-based flash-based memory. Similarly, although primarily described in the context of SONOS type flash memory in which a nitride trap layer is employed, the fabrication described herein may be employed in manufacturing other types of flash memory devices.

As shown, memory 100 includes arrayed memory 110 and memory controller 130. Memory controller 130 is arranged to communicate addressing data and program data over signal path 106. For example, signal path 106 can provide 8, 16, or more I/O lines of data. Memory controller 130 is also configured to access arrayed memory 110 over signal path 103. For example, memory controller 130 can read, write, erase, and perform other operations at portions of arrayed memory 110 via signal path 103. In addition, although shown as single lines, signal path 103 and/or signal path 106 may be distributed across a plurality of signal lines and/or bus lines.

Arrayed memory 110 includes memory sectors 120 (identified individually as sectors 1-*i*) that can be accessed via memory controller 130. Memory sectors 120 can include, for example, 256, 512, 1024, 2048 or more sectors having memory cells that can be individually or collectively accessed. For example, in a NAND-based architecture, the individual memory cells are accessed collectively. In other examples, the number and/or arrangement of memory sectors can be different. In one embodiment, for example, sectors 120 can be referred to more generally as memory blocks and/or can be configured to have a configuration that is different than a bit line, word line, and/or sector topology.

Memory controller 130 includes decoder component 132, voltage generator component 134, and controller component 136. In one embodiment, memory controller 130 may be located on the same chip as arrayed memory 110. In another embodiment, memory controller 130 may be located on a different chip, or portions of memory controller 130 may be located on another chip or off chip. For example, decoder component 132, controller component 134, and voltage generator component 136 can be located on different chips but co-located on the same circuit board. In other examples, other implementations of memory controller 130 are possible. For example, memory controller 130 can include a programmable microcontroller.

Decoder component 132 is arranged to receive memory addresses via addressing signal path 106 and to select individual sectors, arrays, or cells according to the architecture of arrayed memory 110. In an NAND-based architecture, individual memory cells can be accessed collectively but not individually.

Decoder component 132 includes, for example, multiplexer circuits, amplifier circuits, combinational logic, or the like for selecting sectors, arrays, and/or cells based on any of a variety of addressing schemes. For example, a portion of a memory address (or a grouping of bits) can identify a sector within arrayed memory 110 and another portion (or another grouping of bits) can identify a core cell array within a particular sector.

Voltage generator component 134 is arranged to receive one or more supply voltages (not shown) and to provide a variety of reference voltages required for reading, writing, erasing, pre-programming, soft programming, and/or under-erase verifying operations. For example, voltage generator component 134 can include one or more cascode circuits, amplifier circuits, regulator circuits, and/or switch circuits that can be controlled by controller component 136.

Controller component 136 is arranged to coordinate reading, writing, erasing, and other operations of memory 100. In one embodiment, controller component 136 is arranged to receive and transmit data from an upstream system controller (not shown). Such a system controller can include, for example, a processor and a static random access memory (SRAM) that can be loaded with executable processor instructions for communicating over signal path 106. In another embodiment, controller component 136 as well as other portions of memory controller 130 may be embedded or otherwise incorporated into a system controller or a portion of a system controller.

Embodiments of controller component 136 can include a state machine and/or comparator circuits. State machine and comparator circuits can include any of a variety of circuits for invoking any of a myriad of algorithms for performing reading, writing, erasing, or other operations of memory 100. State machines and comparator circuits can also include, for example, comparators, amplifier circuits, sense amplifiers, combinational logic, or the like.

In one embodiment, memory 100 is a flash-based memory including flash-based memory cells, such as flash-based NAND cells, NOR cells, or hybrids of the two.

Figure 2:
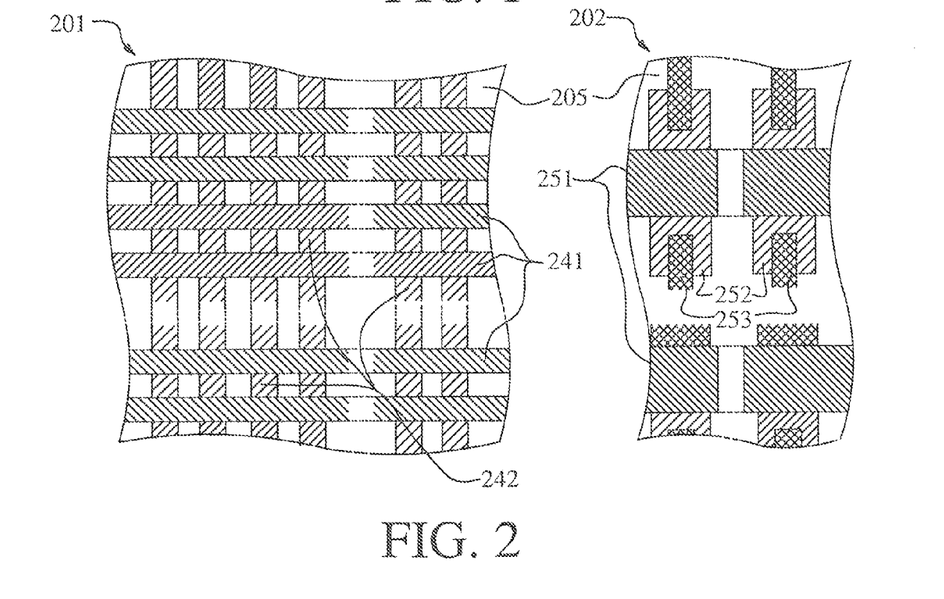
FIG. 2 shows a partial top plan view of an embodiment of core and peripheral sections of a memory that may be employed in the memory of FIG. 1.

FIG. 2 shows a partial top plan view of separate sections of a memory. Core section 201, for example, may be an embodiment of a portion of sector 120 of FIG. 1 and may include arrayed core memory cells. Peripheral section 202, for example, may be an embodiment of memory controller 110 of FIG. 1 or a portion of memory controller 110 of FIG. 1.

Core section 201 includes core polysilicon lines 241, conductive regions 242, and a portion of substrate 205. Portions of core polysilicon lines 241 are coupled to the gates of individual memory cells (not shown in FIG. 2) and can be configured as a word line, a source select gate line, and/or a drain select gate line. Portions of conductive regions 242 can include, for example, p-type and/or n-type doped regions of substrate 205 for forming source/drain regions and/or conductive lines. For example, conductive regions 242 can form portions of bit lines and/or other signal lines. Also, in some embodiments, individual conductive regions 242 extend at least partially underneath individual core polysilicon lines 241.

In one embodiment, core section 201 is arranged in a NOR topology, and individual memory cells can be individually accessed via individual conductive regions 242. In another embodiment, core section 201 is arranged in a NAND topology, and individual memory cells can be accessed though individual conductive regions 242 collectively but not individually. In other embodiments, hybrid architectures can be employed. For example, core section 201 can be configured to have a portion that is NAND-based and another portion that is NOR-based. Also, although not shown if FIG. 2, core section 201 may include any of a variety of interconnect and/or passivation layers, such as dielectric, conductive, or other layers. For example, conductive regions 242 can be positioned beneath a dielectric spacer layer.

Peripheral section 202 includes peripheral polysilicon lines 251, conductive regions 252, and interconnects 253. Portions of peripheral polysilicon lines 251 are coupled to individual peripheral devices (not shown in FIG. 2).

Portions of conductive regions 252 can include, for example, p-type and/or n-type doped regions of substrate 205 for forming conductive features, such as a source, a drain, or other type of well. Interconnects 253 can include conductive lines that electrically intercouple portions of peripheral section 202 and/or electrically couple core section 201 with peripheral section 202. For example, interconnects 253 can include a combination of metal lines and vias. Also, although not shown FIG. 2, peripheral section 202 may also include any of a variety of other interconnect and/or passivation layers.

Figure 3:
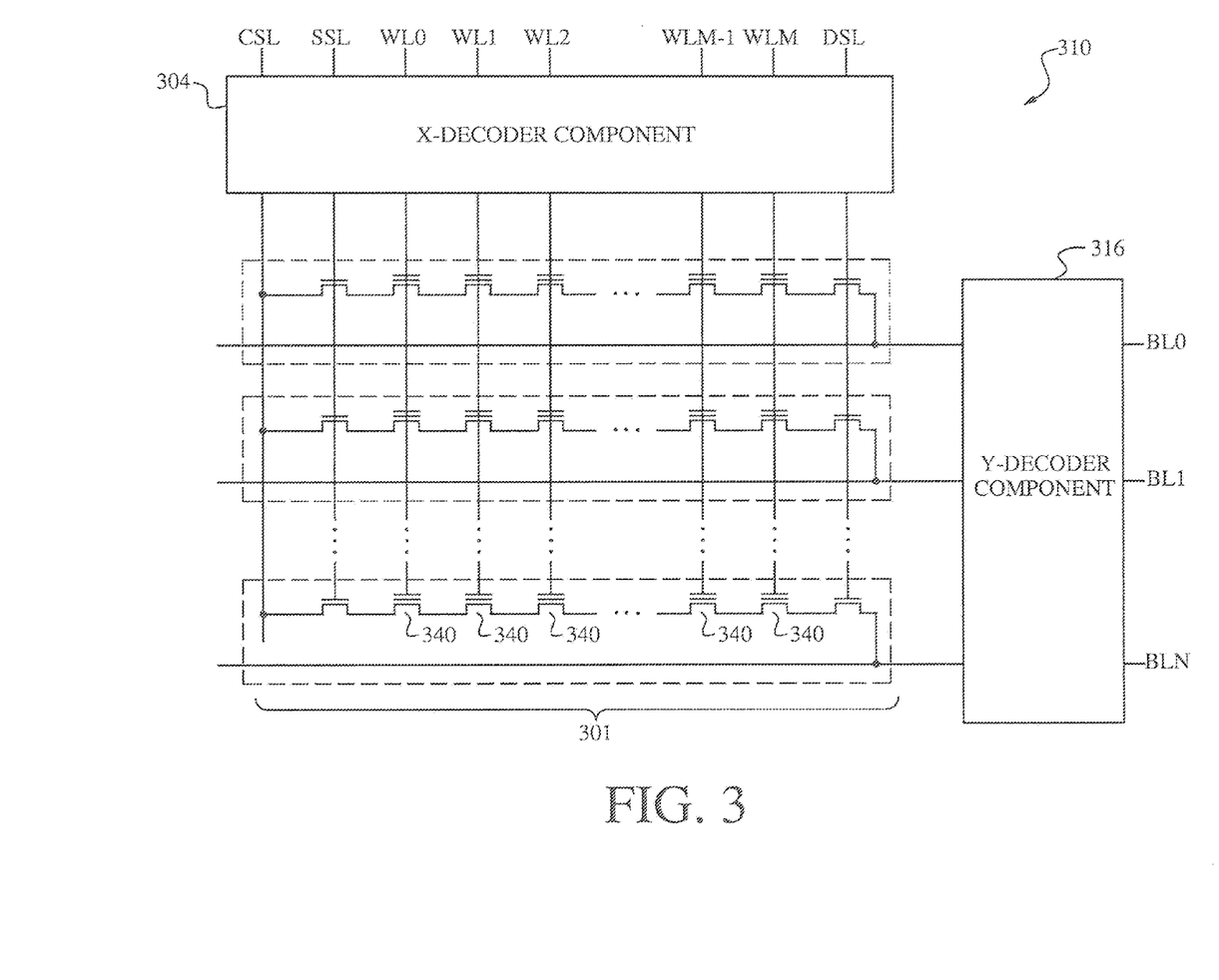
FIG. 3 illustrates a block diagram of an embodiment of a NAND memory array.

FIG. 3 illustrates a block diagram of an embodiment of a NAND memory array (310) that may be employed as an embodiment of memory array 110 of FIG. 1. Memory array 310 includes memory cells 340. Each memory cell 340 stores one or more bits of data. Memory array 310 can be associated with an X-decoder component 304 (e.g., word line (WL) decoder) and a Y-decoder component 316 (e.g., bit line (BL) decoder) that can each respectively decode inputs/outputs during various operations (e.g., programming, reading, verifying, erasing) that can be performed on the memory cells 340. The X-decoder component 304 and Y-decoder component 316 can each receive address bus information from memory controller 130 of FIG. 1, and can utilize such information to facilitate accessing or selecting the desired memory cell(s) (e.g., memory location(s)) associated with the command. The memory cells 340 can be formed in M rows and N columns. A common WL can be attached to the gate of each memory cell 340 in a row, such as word-lines WL0, WL1, WL2, through WLM. A common BL is attached collectively to cells 340, such as bit-lines BL0, BL1, through BLN as depicted in the respective diagrams. Respective voltages can be applied to one or more cells 340 through the WLs and BLs to facilitate performing operations, such as program, read, erase, and the like.

In some embodiments, the X-decoder component 304 is a WL encoder that receives a word line voltage that may be a relatively high boosted voltage. In this case, the X-decoder component 304 may contains transistors with high-voltage gate oxides. Other transistors in NAND memory array 310 that do not need such high voltages have low voltage gate oxides. The high voltage gate oxides need to be significantly thicker than the low voltage gate oxides due to the higher voltages that may be applied to the gate.

Figure 4:
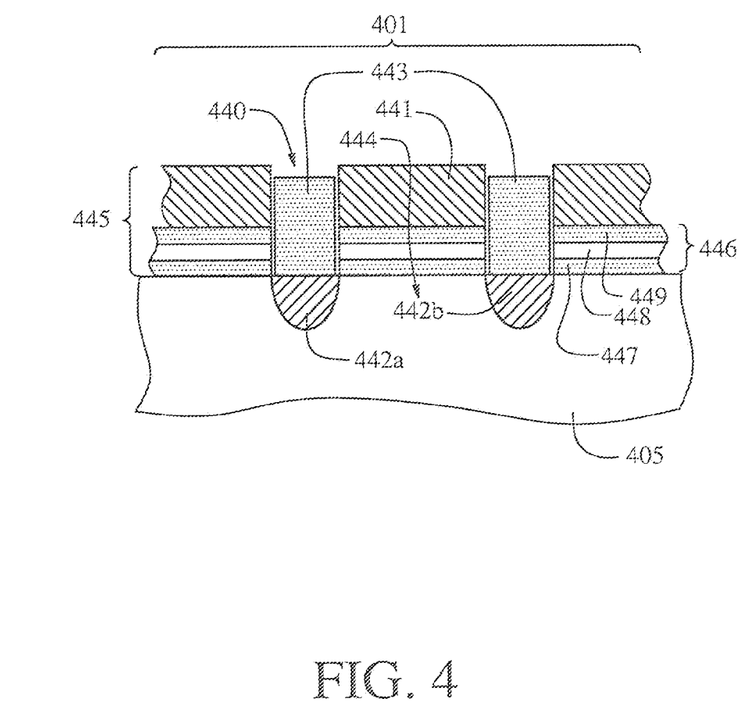
FIG. 4 shows a cross-sectional side view of an embodiment of a core section of FIG. 2.

FIG. 4 shows a cross-sectional side view of a memory cell in core section 401. In one embodiment, core section 401 is an embodiment of core section 201 of FIG. 2.

Memory cell 440 includes a portion of substrate 405, dielectric spacer layer 443, channel region 444, source/drain regions 442a and 442b, and layered stack 445, including charge trapping component 446 and a portion of core polysilicon line 441. Substrate 405 may be an embodiment of substrate 205 of FIG. 2. Source/drain regions 442a and 442b may be an embodiment of one or more conductive regions 242 of FIG. 2. Core polysilicon line 441 may be an embodiment of an individual core polysilicon line 241 of FIG. 2.

In operation, core polysilicon line 441 and source/drain regions 442a and 442b are configured to provide electrical potential(s) to memory cell 440 for trapping charge at charge trapping component 446. A bit is "programmed" when it is trapping a charge and "unprogrammed" when it is not trapping charge. To trap charge, charge trapping component 446 employs tunneling layer 447, charge trapping layer 448, and dielectric layer 449. In general, tunneling layer 447 provides a tunneling barrier, charge trapping layer 448 is a layer that is configured to store charge, and dielectric layer 449 electrically isolates charge trapping layer 448 from core polysilicon line 441. In one embodiment, memory cell 440 is a one bit memory cell that is configured to store up to two logic states. In another embodiment, memory cell 440 can store more than two logic (or bit) states.

In some embodiments, charge trapping component 446 is an oxide-nitride-oxide (ONO) layer in which dielectric layer 449 is an oxide (such as silicon dioxide), charge trapping layer 448 is a nitride, and tunneling layer 447 is an oxide (such as silicon dioxide). In one embodiment in which charge trapping layer 448 is a nitride, charge trapping layer 448 may be a silicon-rich nitride (SIRN) such as silicon nitride.

Dielectric spacer layer 443 is an oxide-nitride spacer. During the fabrication of memory device 443, dielectric spacer layer 443 is fabricated in such a way that the spaces between word line gates in the dense array of word line gates in the flash memory are completely gap-filled.

Figure 5:
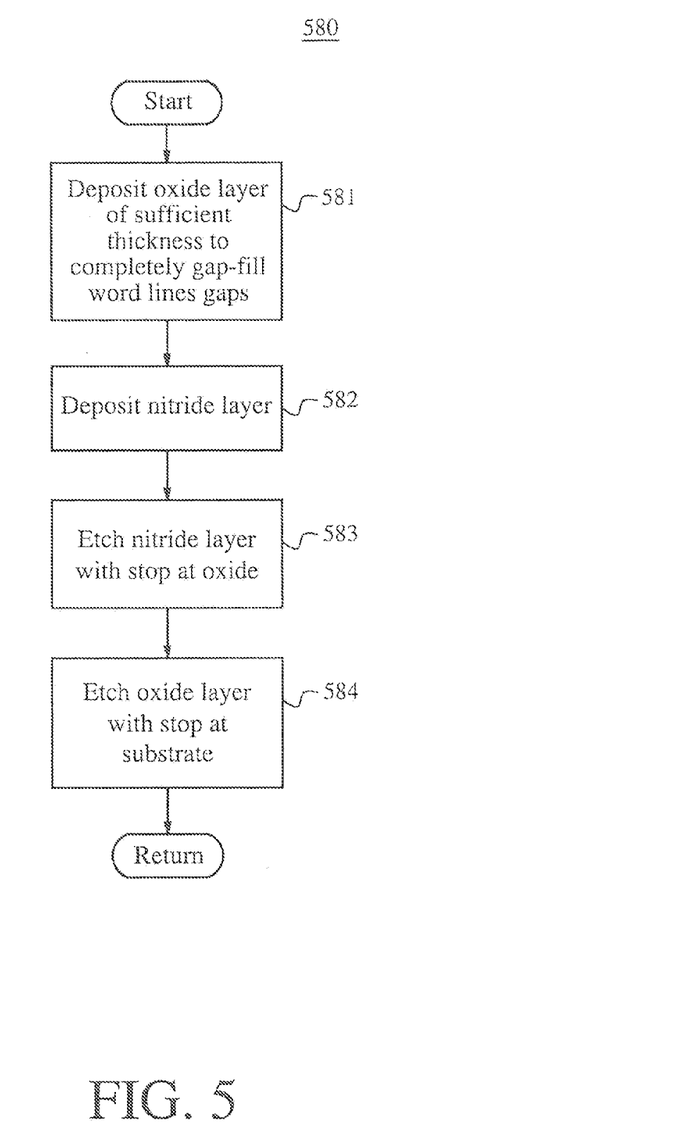
FIG. 5 illustrates a flow chart of an embodiment of a process for dual spacer formation.
Figure 6A:
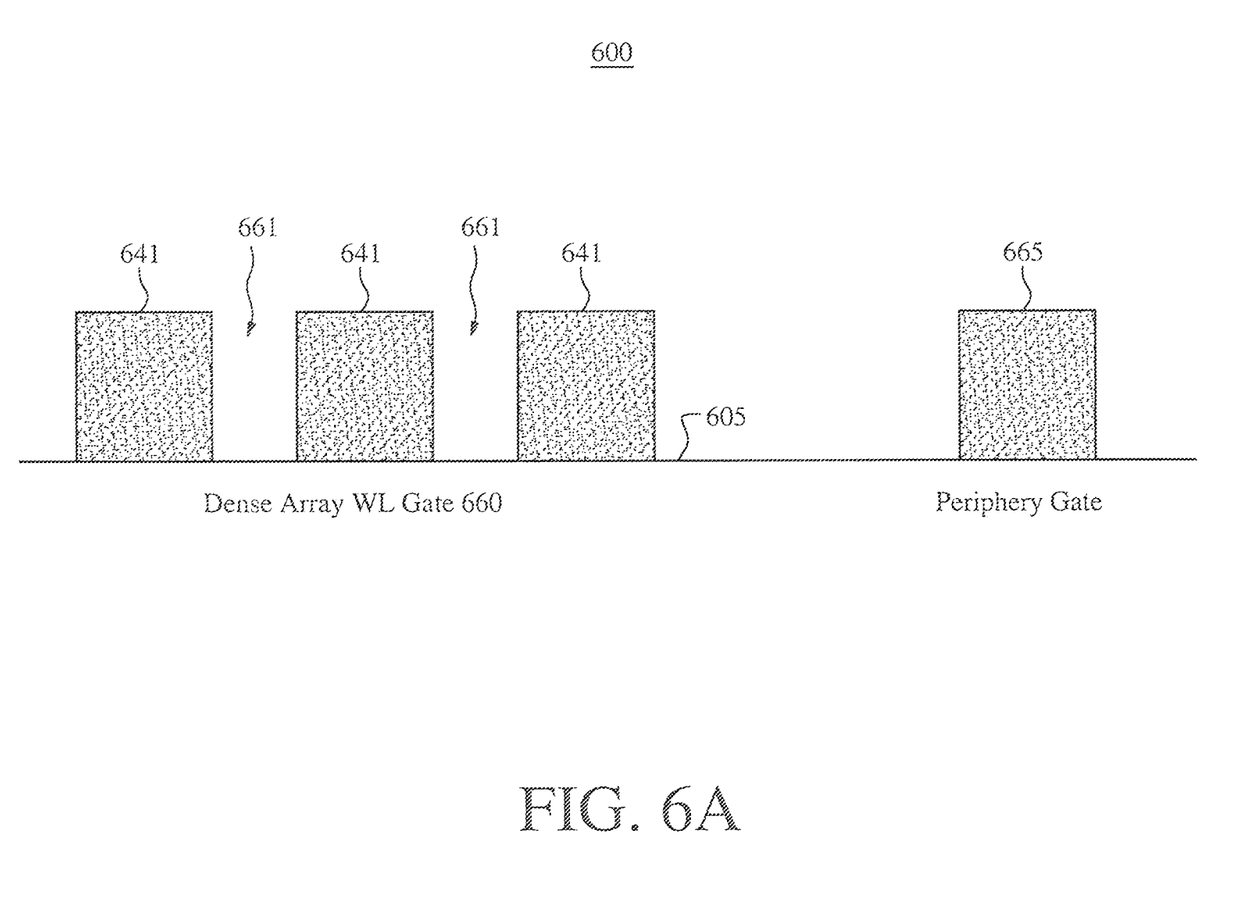
FIGS. 6A-E show an embodiment of a flash memory cell undergoing an embodiment of the process of FIG. 5.

FIG. 5 illustrates a flow chart of an embodiment of a process (580) for dual spacer formation. FIGS. 6A-E show an embodiment of flash memory device 600 undergoing an embodiment of process 580. At the start block, an embodiment of flash memory device 600 is shown in FIG. 6A. Flash memory device 600 includes one or more periphery gates 665, substrate 605, and dense array 660 of word line gates 641 with gaps 661 between each of the word lines gates 641 in dense array 660. Dense array 660 is in the core section of memory device 600, and the one or more periphery gates 665 are in the periphery section of memory device 600. Each word line gate 641 is the polysilicon portion of the gate. In some embodiments, an ONO layer is underneath the polysilicon, as discussed above and shown in FIG. 4 for some embodiments.

Figure 6B:
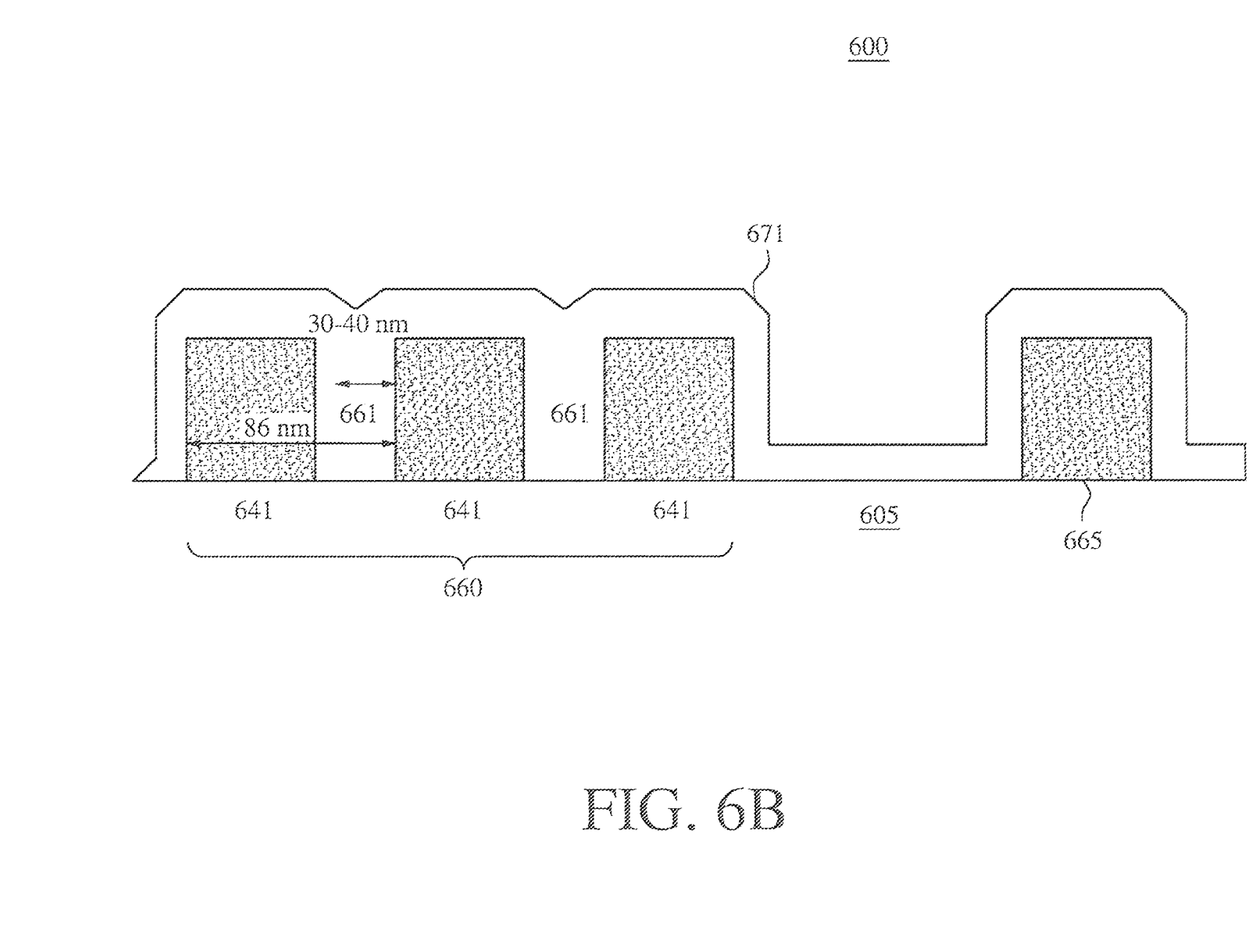

After a start block, the process proceeds to block 581, where an oxide layer 671 is deposited over flash memory device 600 such that the deposited oxide layer 671 is at least 250 Angstroms thick. The preferred oxide thickness is between 300 Angstroms and 500 Angstroms, but the invention is not so limited. Further, the preferred oxide thickness varies according to various factors, as discussed in greater detail below. The deposited oxide layer 671 is deposited such that it completely gap-fills the gaps 661 between word line gates 641 of dense array 660 of word line gates. In some embodiments, the oxide layer is provided by low-pressure chemical vapor deposition under heating by furnace. For example, in some embodiments, high-temperature oxide deposition (HTO) or tetraethyl orthosilicate (TEOS) may be used for the oxide deposition. FIG. 6B shows memory device 600 after this step.

Figure 6C:
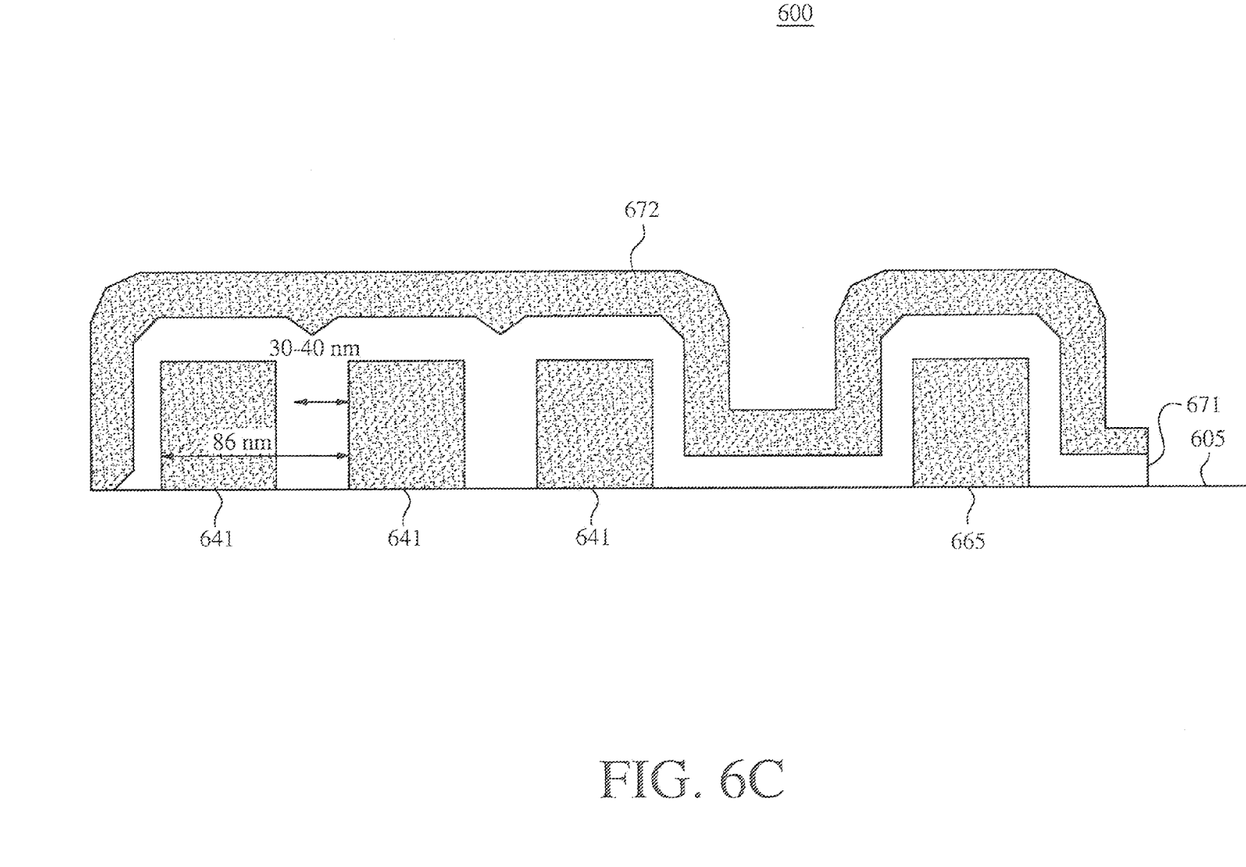
Figure 6D:
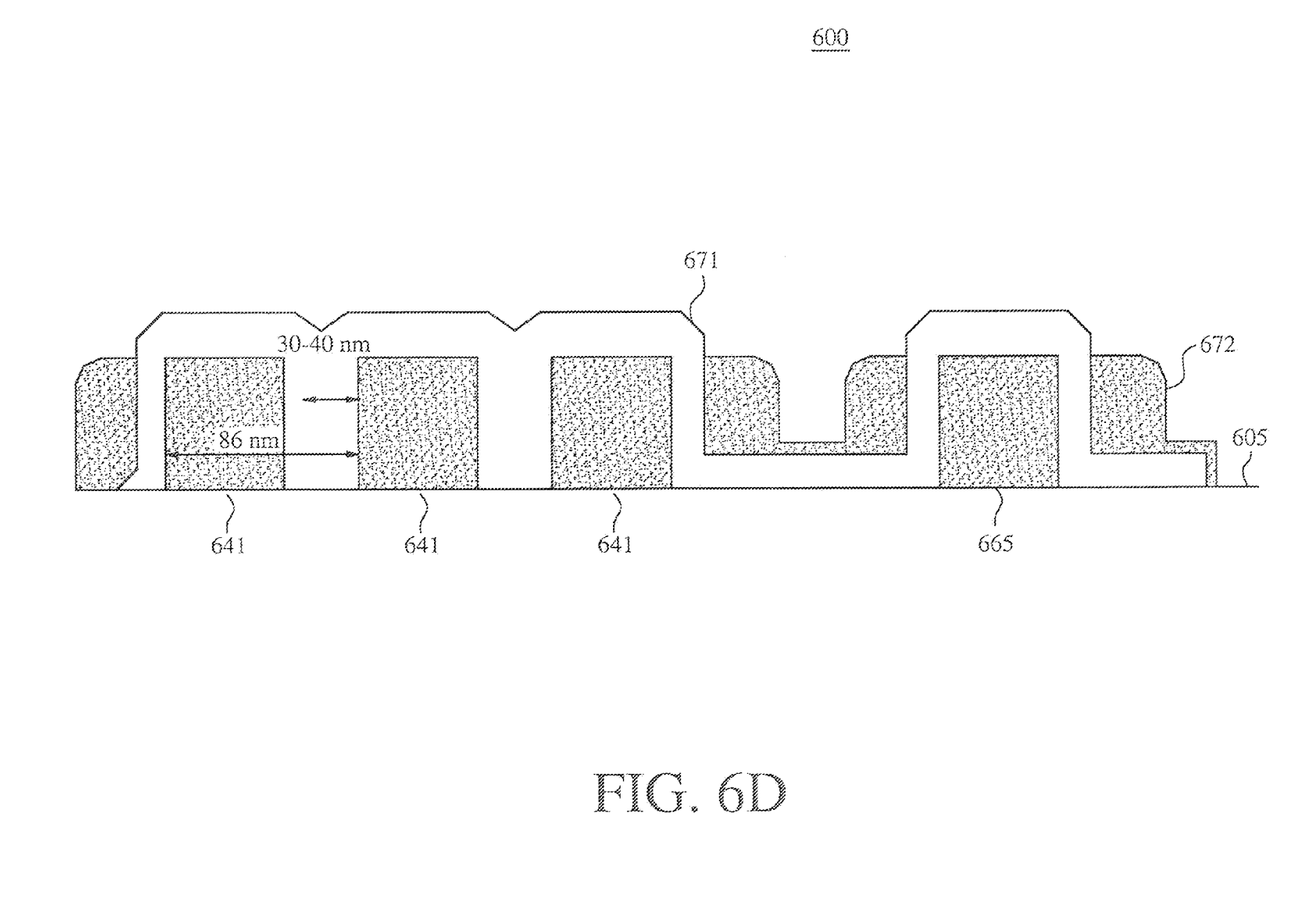
Figure 6E:
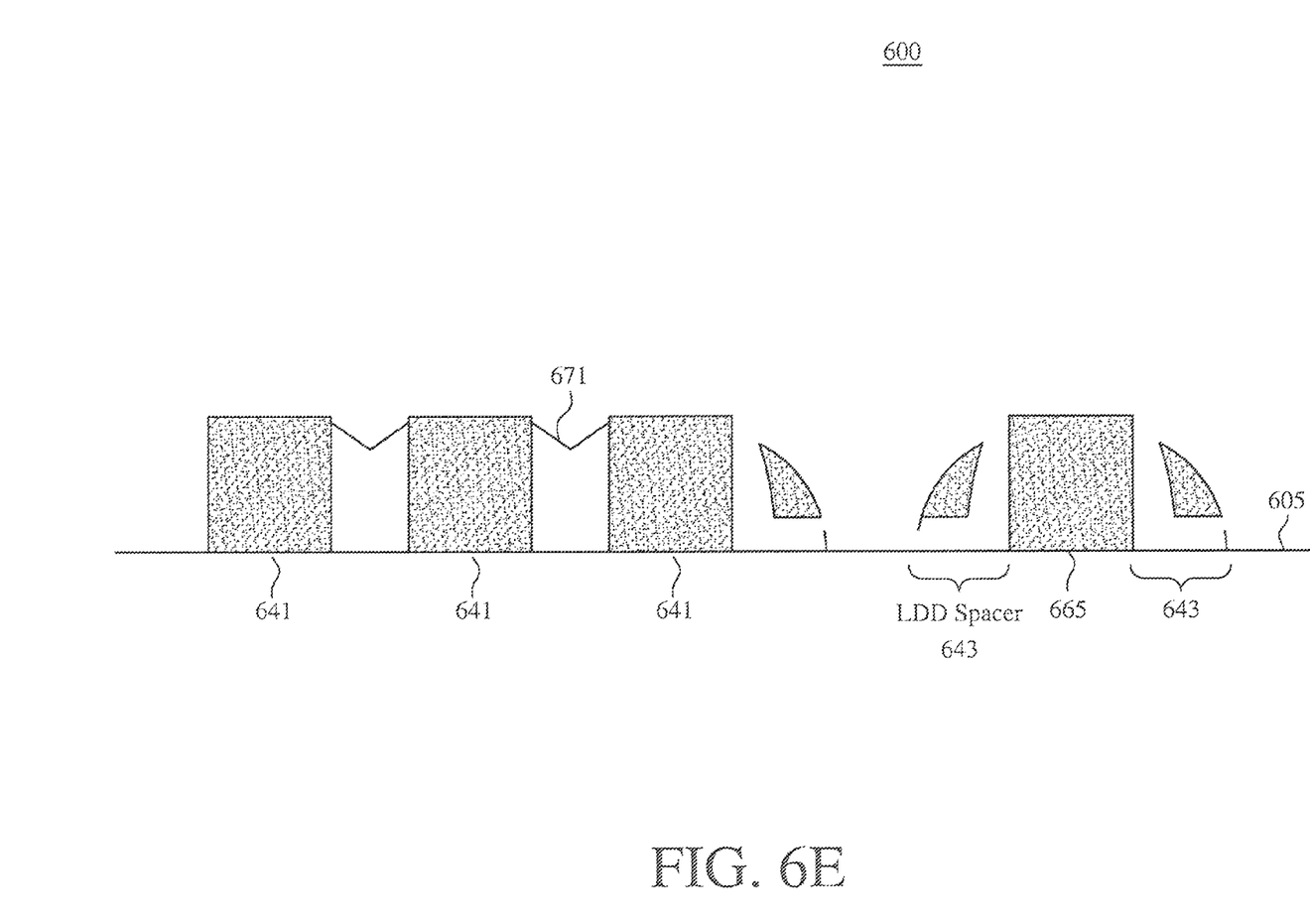

Next, the process advances to block 582, where nitride layer 672 is deposited over the oxide layer 671. In some embodiments, the nitride deposition is accomplished by lower-pressure chemical vapor deposition under furnace heating. FIG. 6C shows memory device 600 after this step. The process then proceeds to block 583, where nitride layer 672 is etched until the at least a portion of the oxide layer 671 is exposed. In some embodiments, the etching is accomplished by plasma etching. FIG. 6D shows memory device 600 after this step. Next, the process moves to block 584, where oxide layer 671 is etched until at least a portion of substrate 605 is exposed. In some embodiments, the etching is accomplished by plasma etching. FIG. 6E shows memory device 600 after this step. At this point, each periphery gate has two oxide-nitride spacers 643. The process then advances to a return block, where other processing is resumed.

Spacers 643 protect the periphery gates 665 from diffusion during a subsequent dopant implant step to dope the lightly-doped drains (LDDs) of the cells in the periphery. Spacers 643 offset the implant during the implant phase to provide this protection. The use of nitride in spacers 643 minimizes the formation of metallic material forming on the sidewall during a subsequent phase of nickel silicide formation on the top of the gate polysilicon.

Because the gaps 661 between the word line gates 661 of the dense array 660 are completely gap-filled, no spacer nitride gets trapped in the core oxide spacer. If spacer nitride became trapped between word lines and/or between the edge word line and the selective gate, it could trap electrons during erase and cause string current reduction. However, process 580 ensures that no spacer nitride gets trapped in the core oxide spacer. Previously, the inventors used approximately 100 Angstroms of thickness for the oxide layer, which allowed spacer nitride to be trapped. However, accordingly to aspects of the invention, an oxide layer of sufficient thickness to gap-fill the spaces between the dense array are used so that the spacer nitride does not become trapped. The oxide thickness is accordingly a crucial parameter, but the exact optimal thickness may vary accordingly a number of different factors, including process and the design dimensions used for various portions of the memory device, including the distance between adjacent word lines.

A particular thickness for the dual spacer 643 may be desired in some embodiments, in order to optimally protects the periphery gate from diffusion by providing the proper amount of offset during the LDD implant, and the optimal thickness of dual spacer 643 may be expressed as a critical dimension (CD) requirement in some embodiments. For example, in some embodiments, the CD requirement for the LDD spacer thickness is 800 Angstrom. Accordingly, for example, in these embodiments, when the oxide layer 671 is 300 Angstroms thick, the nitride layer 672 is 500 Angstroms thick.

Modern semiconductor devices are typically created as integrated circuits manufactured on the surface of a substrate of semiconductor material. The processing begins by growing a wafer, which is typically done using the Czochralski process. Various devices are formed on the wafer using a series of steps that include deposition, removal processes (such as etching), patterning, and doping. Few steps or many hundreds of such steps may be used in various designs. The patterning steps may be performed by photolithography or other lithographic methods. For example, the wafer may be coated with a photoresist, which is exposed with a device that exposes light through photomasking, exposing portions of the wafer not blocked by the photomask to light. The exposed regions are removed so that the photoresist remains only in areas that were not exposed to light. This allows a layer to be etched according to the pattern on the photomask. After the devices have been formed on the wafer, various back-end processing and packaging is performed, including properly interconnecting the devices and bringing metal lines to the chip edge for attachment to wires.

A designer creates the device design in accordance with a set of design rules provided by the fabricator, and creates a series of design files based on the design. Various design tools may be used by the designer in creating the design, simulating the design, and checking the design for layout rules violations. When completed, the design files are provided to the fabricator, which are used to generate photomasks for use in the fabricating the device. The design files may be communicated in different ways, including over a network.

Figure 7:
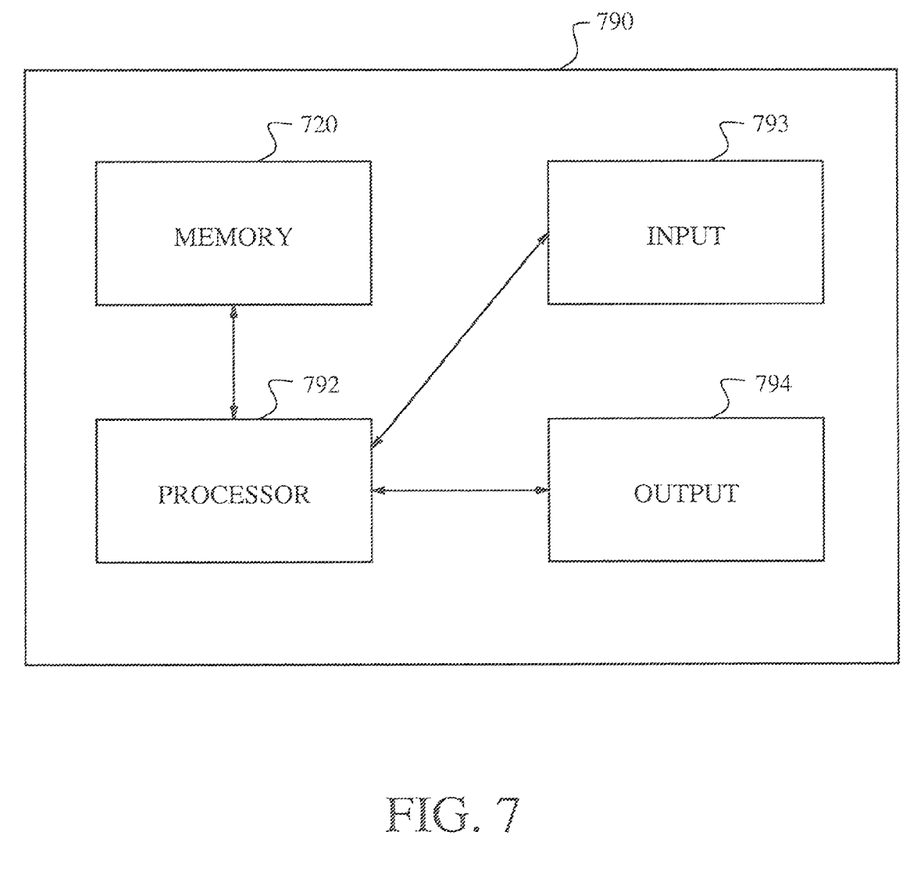
FIG. 7 illustrates a block diagram of an embodiment of a system that includes the memory device of FIGS. 6A-E, in accordance with aspects of the invention.

Embodiments of memory device 400 of FIG. 4 can be incorporated into any of a variety of components and/or systems, including for example, a processor and other components or systems of such components. FIG. 7 shows one embodiment of system 790, which may incorporate memory 720, which is an embodiment of memory device 400 of FIG. 4. Memory 720 can be directly or indirectly connected to any one of processor 792, input devices 793, and/or output devices 794. In one embodiment, memory 720 may be configured such that it is removable from system 790. In another embodiment, memory 720 may be permanently connected to the components or a portion of the components of system 790.

In many embodiments, memory 720, processor 792, input devices 793, and/or output devices 794 of system 790 are configured in combination to function as part of a larger system. For example, system 790 may be incorporated into a cell phone, a handheld device, a laptop computer, a personal computer, and/or a server device. In addition or alternatively, system 790 can perform any of a variety of processing, controller, and/or data storage functions, such as those associated with sensing, imaging, computing, or other functions. Accordingly, system 790 can be incorporated into any of a wide variety of devices that may employ such functions (e.g., a digital camera, an MP3 player, a GPS unit, and so on).

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A method for memory device fabrication, comprising:
    forming at least one oxide-nitride spacer such that each of the at least one oxide-nitride spacer is adjacent to a corresponding periphery gate, including:
        depositing an oxide layer over a flash memory device such that the deposited oxide layer is at least 250 Angstroms thick, wherein the flash memory device includes a substrate and dense array of word line gates with gaps between each of the word lines gate in the dense array, and such that the deposited oxide layer completely gap-fills the gaps between the word line gates of the dense array of word line gates;
        depositing a nitride layer over the oxide layer;
        etching the nitride layer until the at least a portion of the oxide layer is exposed; and
        etching at least part of the portion of the oxide layer exposed by the nitride layer etching until at least a portion of the substrate is exposed; and
    after forming the at least one oxide-nitride spacer, performing a lightly-doped drain (LDD) deposition, such that each of the at least one oxide-nitride spacer offsets the LDD implant from the corresponding periphery gate such that the light-doped implant creates at least one lightly-doped drain region such that the at least one oxide-nitride spacer causes a location of each of the at least one lightly-doped drain region to be offset away from the corresponding periphery gate.

2. The method of claim 1, wherein the oxide layer is deposited such that the oxide layer has a thickness in a range of about 300 Angstroms to about 500 Angstroms.

3. The method of claim 1, wherein etching the nitride layer is accomplished by plasma etching, and wherein etching the oxide layer is accomplished by plasma etching.

4. The method of claim 1, wherein depositing the oxide layer and depositing the nitride layer are both accomplished by chemical vapor deposition.

5. The method of claim 1, wherein the flash memory device is a NAND device.

6. A tangible machine-readable storage medium including an electronic design file that is arranged to control the performance of the method of claim 1.

7. A method, comprising transmitting, over a network, an article of manufacture including a tangible machine-readable storage medium that includes an electronic design file that is arranged to control the performance of the method of claim 1.

8. The method of claim 1, wherein the flash memory device includes a core section and a periphery section, the dense array of word lines gates is in the core section, and wherein the at least one oxide-nitride spacer is formed in the periphery section.

9. The method of claim 8, wherein the periphery section includes each of the corresponding periphery gates, and wherein the at least oxide-nitride spacer includes a plurality of oxide-nitride spacers, including two oxide-nitride spacers for each periphery gate.

10. A method for memory device fabrication, comprising:
    forming at least one oxide-nitride spacer, including:
        depositing an oxide layer over a flash memory device such that the deposited oxide layer is at least 250 Angstroms thick, wherein the flash memory device includes a substrate and dense array of word line gates with gaps between each of the word lines gate in the dense array, and such that the deposited oxide layer completely gap-fills the gaps between the word line gates of the dense array of word line gates;
        depositing a nitride layer over the oxide layer;

etching the nitride layer until the at least a portion of the oxide layer is exposed; and etching at least part of the portion of the oxide layer exposed by the nitride layer etching until at least a portion of the substrate is exposed, wherein the periphery section includes a plurality of periphery gates, and wherein the at least oxide-nitride spacer includes a plurality of oxide-nitride spacers, including two oxide-nitride spacers for each periphery gate; and performing a lightly-doped drain implant, wherein the plurality of oxide-nitride spacers offset the lightly-doped drain implant from the plurality of periphery gates such that the light-doped implant creates lightly-doped drain regions such that the oxide-nitride spacers cause locations of the lightly-doped drain regions to be offset away from the plurality of periphery gates.

\* \* \* \* \*